United States Patent
Canaperi et al.

(10) Patent No.: US 10,832,917 B2
(45) Date of Patent: *Nov. 10, 2020

(54) LOW OXYGEN CLEANING FOR CMP EQUIPMENT

(71) Applicant: INTERNATIONAL BUSINESS MACHINES CORPORATION, Armonk, NY (US)

(72) Inventors: Donald F. Canaperi, Bridgewater, CT (US); Pavan S. Chinthamanipeta, Clifton Park, NY (US); Raghuveer R. Patlolla, Guilderland, NY (US); Cornelius B. Peethala, Albany, NY (US)

(73) Assignee: International Business Machines Corporation, Armonk, NY (US)

( * ) Notice: Subject to any disclaimer, the term of this patent is extended or adjusted under 35 U.S.C. 154(b) by 207 days.

This patent is subject to a terminal disclaimer.

(21) Appl. No.: 15/618,309

(22) Filed: Jun. 9, 2017

(65) Prior Publication Data

US 2018/0358230 A1 Dec. 13, 2018

(51) Int. Cl.
*H01L 21/306* (2006.01)
*B08B 3/10* (2006.01)
(Continued)

(52) U.S. Cl.
CPC .......... *H01L 21/30625* (2013.01); *B08B 3/08* (2013.01); *B08B 3/10* (2013.01);
(Continued)

(58) Field of Classification Search
CPC ......... H01L 21/30625; H01L 21/02057; H01L 21/67046; H01L 21/67051; B08B 3/08; B08B 3/10
(Continued)

(56) References Cited

U.S. PATENT DOCUMENTS 3,485,750 A 12/1969 Albertson
6,004,399 A * 12/1999 Wong ........................ B08B 3/04
134/2
(Continued)

FOREIGN PATENT DOCUMENTS

CN 101146901 A 3/2008
CN 101386149 A 3/2009
(Continued)

OTHER PUBLICATIONS

International Search Report and Written Opinion in corresponding International Patent Application No. PCT/IB2018/054050 dated Sep. 29, 2018 (pp. 1-9).
(Continued)

*Primary Examiner* — Tinsae B Ayalew
(74) *Attorney, Agent, or Firm* — Tutunjian & Bitetto, P.C.; James Nock

(57) ABSTRACT

A method is presented for post chemical mechanical polishing (PCMP) clean for cleaning a chemically-mechanically polished semiconductor wafer. The method includes planarizing the semiconductor wafer, subjecting the semiconductor wafer to a de-oxygenated mixture of DI water and PCMP solution, and applying a de-oxygenated environment during the cleaning. The solution can be de-oxygenated by nitrogen degas or by introducing a reducing agent. The environment can be de-oxygenated by purging with an inert gas, such as nitrogen.

11 Claims, 4 Drawing Sheets

(51) Int. Cl.
  *B08B 3/08* (2006.01)
  *H01L 21/67* (2006.01)
  *H01L 21/02* (2006.01)

(52) U.S. Cl.
  CPC .. *H01L 21/02057* (2013.01); *H01L 21/02074* (2013.01); *H01L 21/67046* (2013.01); *H01L 21/67051* (2013.01)

(58) Field of Classification Search
  USPC ........................................................ 134/95.1
  See application file for complete search history.

(56) References Cited

U.S. PATENT DOCUMENTS

| | | | |
|---|---|---|---|
| 6,007,407 A | 12/1999 | Custer et al. | |
| 6,315,858 B1 | 11/2001 | Shinozuka et al. | |
| 6,416,676 B1 | 7/2002 | Hill | |
| 6,435,943 B1 | 8/2002 | Chang et al. | |
| 6,447,632 B1 | 9/2002 | Shinozuka et al. | |
| 6,492,308 B1 | 12/2002 | Naghshineh et al. | |
| 6,838,116 B2 | 1/2005 | Liu et al. | |
| 6,903,004 B1 | 6/2005 | Spencer et al. | |
| 7,030,023 B2 | 4/2006 | Pan et al. | |
| 7,112,119 B1 | 9/2006 | Swedek et al. | |
| 7,726,325 B2 | 6/2010 | Saiki et al. | |
| 7,772,128 B2 | 8/2010 | Kolics et al. | |
| 8,087,418 B2 | 1/2012 | Saiki et al. | |
| 9,343,649 B1 | 5/2016 | Cooper | |
| 2001/0008800 A1 | 7/2001 | Koch | |
| 2003/0094610 A1 | 5/2003 | Aoki et al. | |
| 2003/0137052 A1 | 7/2003 | Horiuchi et al. | |
| 2003/0186544 A1 | 10/2003 | Matsui et al. | |
| 2003/0188828 A1 | 10/2003 | Boege et al. | |
| 2004/0009670 A1 | 1/2004 | Preusse et al. | |
| 2004/0142564 A1 | 7/2004 | Mullee et al. | |
| 2004/0198190 A1 | 10/2004 | Basol et al. | |
| 2005/0148290 A1* | 7/2005 | De Rege Thesauro | H01L 21/3212 451/41 |
| 2006/0155110 A1 | 7/2006 | Schmid et al. | |
| 2006/0285045 A1 | 12/2006 | Nishikawa et al. | |
| 2006/0285945 A1 | 12/2006 | Hofmeister et al. | |
| 2008/0153394 A1 | 6/2008 | Gutierrez et al. | |
| 2008/0156347 A1 | 7/2008 | Haibara et al. | |
| 2010/0282733 A1 | 11/2010 | Chin | |
| 2011/0030722 A1 | 2/2011 | Ida et al. | |
| 2011/0244680 A1 | 10/2011 | Tohnoe et al. | |
| 2013/0261040 A1 | 10/2013 | Kawada et al. | |
| 2015/0259632 A1 | 9/2015 | Nakanishi et al. | |
| 2016/0272924 A1 | 9/2016 | Kajikawa et al. | |
| 2017/0158992 A1 | 6/2017 | Ivanov et al. | |
| 2017/0211706 A1 | 7/2017 | Amir et al. | |
| 2017/0213763 A1 | 7/2017 | Matsumoto | |
| 2018/0002081 A1 | 1/2018 | Lutz et al. | |
| 2018/0182666 A1 | 6/2018 | Uzoh et al. | |

FOREIGN PATENT DOCUMENTS

| | | |
|---|---|---|
| CN | 102146089 A | 8/2011 |
| KR | 1020100070308 A | 6/2010 |
| WO | 2016/011331 A1 | 1/2016 |

OTHER PUBLICATIONS

Office Action with cited art in corresponding U.S. Appl. No. 15/830,313 dated Feb. 26, 2019.
Office Action with cited art in corresponding U.S. Appl. No. 15/830,313 dated Aug. 7, 2019.
Final Office Action with cited art in corresponding U.S. Appl. No. 15/830,313 dated Jan. 31, 2020 (pp. 1-15).

* cited by examiner

LOW OXYGEN CLEANING FOR CMP EQUIPMENT

BACKGROUND

Technical Field

The present invention relates generally to chemical mechanical polishing of substrates, and more specifically, to a system and method for low oxygen cleaning in chemical mechanical planarization (CMP) equipment.

Description of the Related Art

During manufacturing of semiconductor devices, various processing steps are used to fabricate integrated circuits on a semiconductor wafer. Generally, the processes include a chemical mechanical polishing (CMP) process for planarization of semiconductor wafers. A challenge of the CMP process is to produce a clean substrate surface following the polishing. Thus, a concern with the use of a CMP process is efficient and complete removal of polishing slurry and other polishing residues following polishing in order to prevent introduction of defects into the polished product.

In the fabrication of semiconductor devices, CMP is used to planarize the surface of an entire semiconductor wafer. CMP has three parameters that need to be optimized, that is (1) defects, (2) dishing, and (3) throughput. During fabrication of semiconductor devices, a number of CMP operations are usually carried out and each CMP operation has a unique process condition. To optimize each of the three CMP parameters, a single CMP system usually includes several CMP modules with each module uniquely optimized for each CMP operation.

SUMMARY

In accordance with an embodiment, a method is provided for cleaning a chemically-mechanically polished semiconductor wafer. The method includes planarizing the semiconductor wafer and subjecting the semiconductor wafer to a PCMP solution that is de-oxygenated in the solution and in the chamber ambience. PCMP solution is a mixture of de-ionized (DI) water and chemical additives.

In accordance with another embodiment, a structure is provided for cleaning a chemically-mechanically polished semiconductor wafer. The structure includes a polishing pad having a polishing surface to polish the semiconductor wafer and a PCMP cleaner module configured to subject the semiconductor wafer to a de-oxygenated PCMP solution in de-oxygenated atmosphere.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
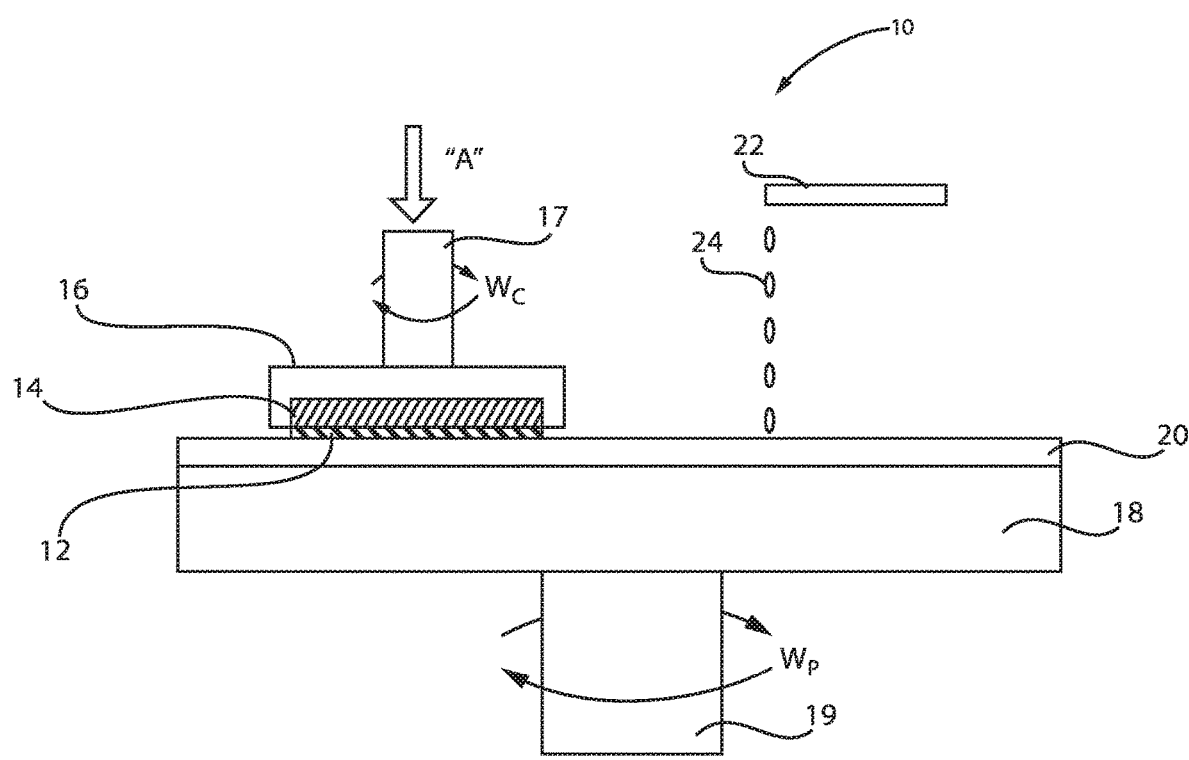
FIG. 1 is a structure for cleaning a chemically-mechanically polished semiconductor wafer, in accordance with an embodiment of the present invention.

Embodiments in accordance with the present invention provide methods and devices for cleaning chemically-mechanically polished semiconductor wafers. Chemical mechanical polishing (CMP) is a process of smoothing surfaces with a combination of chemical and mechanical forces. The CMP process uses an abrasive and corrosive chemical slurry in conjunction with a polishing pad and retaining ring, usually of a greater diameter than the wafer. The pad and wafer are pressed together by a dynamic polishing head and held in place by a plastic retaining ring. The dynamic polishing head is rotated with different axes of rotation. This removes material and tends to even out any irregular topography, making the wafer flat or planar. This may be necessary to set up the wafer for the formation of additional circuit elements. However, complete removal of polishing slurry and other polishing residues and particulates is of concern. Remaining slurry, residues, and/or particulate can introduce defects into the polished product. Other types of defects that can also occur following CMP include scratches, crystalline growth defects, and the like.

Embodiments in accordance with the present invention provide methods and devices for cleaning chemically-mechanically polished semiconductor wafers in a quick and repeatable fashion without introducing additional defects or damage to a surface of the semiconductor wafers. The cleaning methods presented herein are low oxygen cleaning methods employed in CMP equipment. By eliminating dissolved oxygen, metal corrosion reactions can be reduced. This results in no material/metal loss, uniform cap deposition due to lack of metal support, no downstream plasma etch and wet clean attack at the interface from next level build, lower resistance, and dendrite mitigation. The low oxygen cleaning methods presented herein include deoxygenating liquids dispensed on the wafer and deoxygenating the atmosphere with an inert gas (e.g., nitrogen). Thus, a dual oxygenation process takes place to reduce or eliminate defects or damage to wafers.

In a first low oxygen scheme, an inert gas can be used to supplement cleaning of the CMP equipment. The inert gas can be, e.g., a nitrogen gas. In a second low oxygen scheme, a reducing agent can be used to supplement cleaning of the CMP equipment. The reducing agent can be, e.g., an ascorbic acid or a phosphorous acid. Thus, an oxygen scavenger is introduced in a low oxygen environment to contain any oxygen ingression into liquid. The low oxygen environment can be accomplished by introducing or exposing the semiconductor wafer to a nitrogen-containing ambient. The nitrogen-containing ambient can be selected from the group consisting of $N_2$, $NH_3$, $NH_4$, NO, and $NH_x$, where x is between 0-1. The nitrogen-containing ambient can aid in further de-oxygenating an atmosphere the semiconductor wafer is exposed to.

The word "exemplary" is used herein to mean "serving as an example, instance, or illustration." Any embodiment described herein as "exemplary" is not necessarily to be construed as preferred or advantageous over other embodiments. Likewise, the term "embodiments" does not require that all embodiments include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a structure for cleaning a chemically-mechanically polished semiconductor wafer, in accordance with an embodiment of the present invention.

One process in the manufacture of semiconductor hard disk and light emitting diode (LED) wafers is CMP. This technique is used to provide the necessary planarity of the substrate wafer and also re-planarization at certain intermediate points post deposition and for lithographic processing of structures that are built on the wafer. The principal need for planarization is to assure functionality of multilevel interconnects present in the structure. CMP is a process of smoothing surfaces with the combination of chemical and mechanical forces, a hybrid of chemical etching and free abrasive polishing. Mechanical grinding alone causes too much surface damage, while wet etching alone cannot attain good planarization. Most chemical reactions are isotropic and etch different crystal planes with different speed. CMP involves both effects at the same time.

In addition to this, planarization can also be used to minimize the wafer thickness whilst maintaining uniformity. For example, in CMP structure 10 of FIG. 1, a wafer 12 is fitted onto a rotating fixture including a carrier film 14 and a wafer carrier 16, and then pressed against a rotating polishing pad 20 during the CMP process. The wafer carrier 16 can include a component 17 for receiving a load or down force "A" to press the wafer 12 against the polish pad 20. The polish pad 20 can be fixed to a platen 18, which is driven by a component 19. Component 19 can be rotated by an external force. Simultaneously, an abrasive chemical liquid, known as a slurry 24, is distributed from a slurry dispenser 22 between the pad 20 and the wafer 12.

The semiconductor wafer 12 can be made of silicon or other semiconductor materials. Alternatively or additionally, the semiconductor wafer 12 can include other elementary semiconductor materials such as germanium (Ge). In some embodiments, the semiconductor wafer 12 is made of a compound semiconductor such as silicon carbide (SIC), gallium arsenic (GaAs), indium arsenide (InAs), or indium phosphide (InP). In some embodiments, the semiconductor wafer 12 is made of an alloy semiconductor such as silicon germanium (SiGe), silicon germanium carbide (SiGeC), gallium arsenic phosphide (GaAsP), or gallium indium phosphide (GaInP). In some embodiments, the semiconductor wafer 12 includes an epitaxial layer. For example, the semiconductor wafer 12 has an epitaxial layer overlying a bulk semiconductor. In some other embodiments, the semiconductor wafer 12 can be a silicon-on-insulator (SOI) or a germanium-on-insulator (GOI) substrate.

The semiconductor wafer 12 can have various device elements. Examples of device elements that are formed in the semiconductor wafer 12 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes. In some embodiments, a shallow trench isolation (STI) layer, an inter-layer dielectric (ILD), or an inter-metal dielectric layer covers the device elements formed on the semiconductor wafer 12.

The pad surface 21 is provided with pad rotation and concentric grooves that facilitate the transportation of the slurry 24 across the pad-wafer interface. The purpose of the slurry 24 is to loosen the surface of the wafer 12 for the removal of material by the rough surface of the pad 20. The surface properties of the polishing pad 20 influence the amount of material removed from the wafer 12 and the overall quality of the process. Continuous reconditioning of the pad surface 21 by abrasion is needed as it gets degraded during polishing. A rotating abrasive or a conditioning disk made up of stainless steel or electroplated diamond is used for reconditioning the pad surface 21.

However, the CMP structure 10 can cause defects on the wafer 12 by the polishing pad 20. Defect reduction is a meaningful task in yield and reliability improvement for semiconductor manufacturing. For back-end of the line (BEOL) processes with copper (Cu) interconnects, the defects associated with the CMP process are quite often a major yield detractor to such an extent that their reduction becomes a pivotal step in the successful qualification and implementation of such technology.

Since CMP is the final and enabling process before one level of Cu interconnect is fully defined, not only can it generate defects during the process per se (e.g., scratches and polish residues), but it can also reveal defects generated from prior processing steps, such as post reactive ion etching (RIE) cleaning, liner deposition, and Cu plating. Therefore, not only should the post Cu CMP cleaning process clean up the defects generated by CMP, it should also be sufficiently compatible with prior processes to prevent exacerbating pre-existing defects incoming to CMP.

In principle, a robust post Cu CMP cleaning process removes the polish residues (PR), foreign materials (FM), abrasive particles, or any debris left on the wafer surface as a result of the polish. In addition, a post Cu CMP cleaning process passivates the Cu surface long and effectively enough to inhibit time-dependent Cu corrosion in form of hollow metal (HM) and Cu nodules or dendrites (DE).

Figure 2:
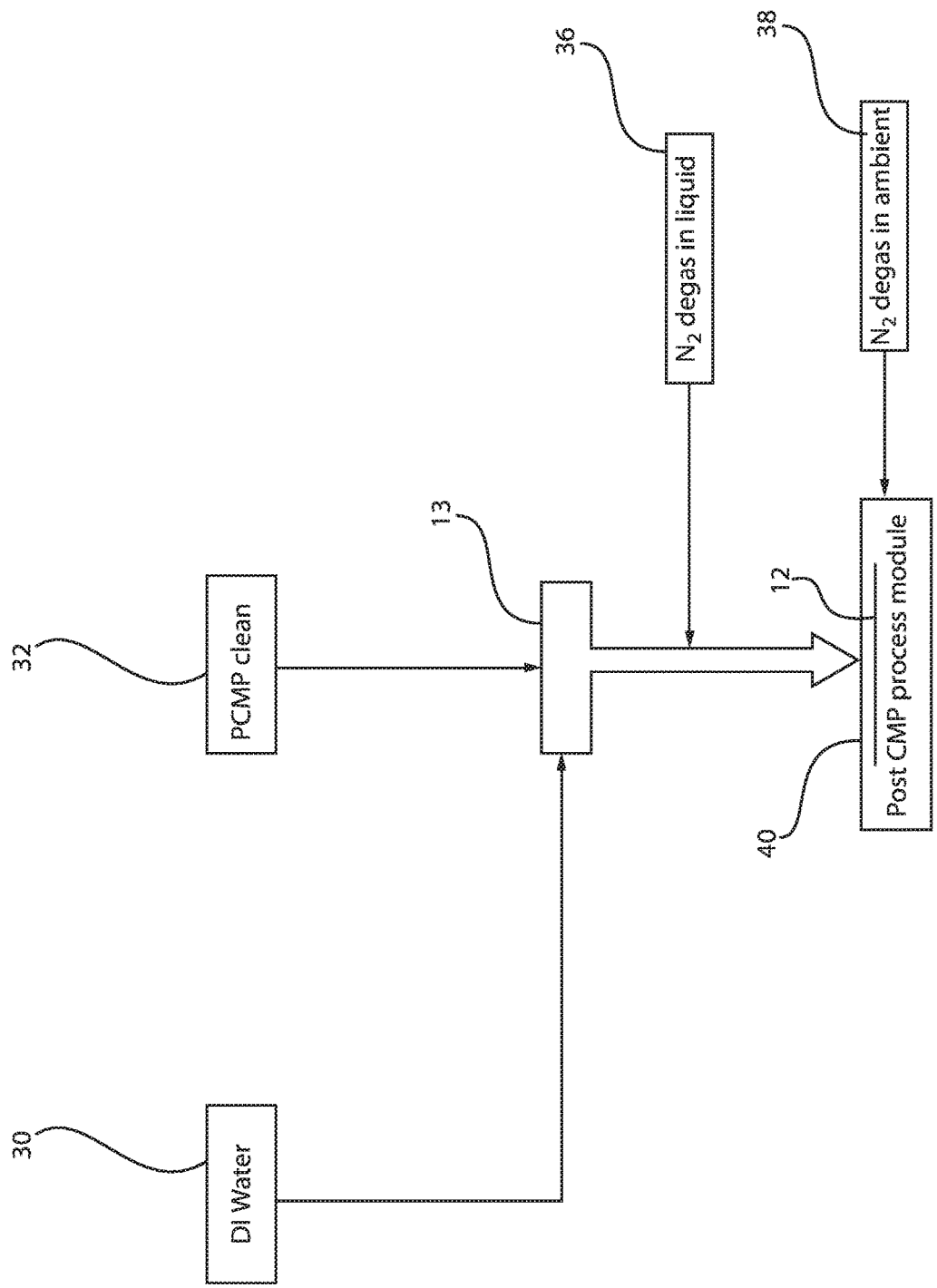
FIG. 2 is a low oxygen scheme for post-CMP cleaning employing an inert gas, in accordance with an embodiment of the present invention.
Figure 3:
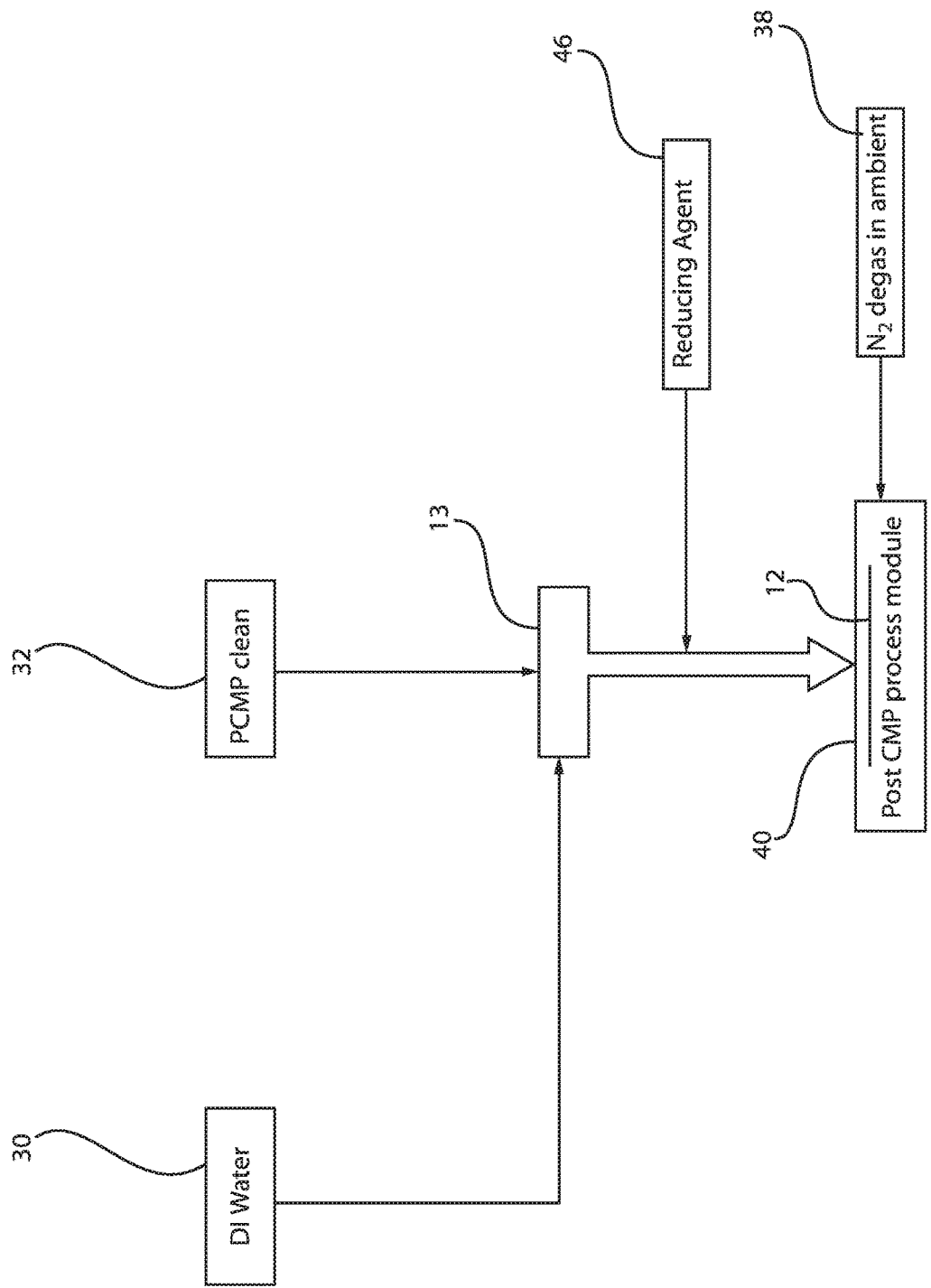
FIG. 3 is a low oxygen scheme for post-CMP cleaning employing a reducing agent in a liquid, in accordance with another embodiment of the present invention.

CMP can be employed in any conventional polishing tool and a wide variety of conditions, e.g., polishing pressure, speeds, and polishing pads, as known to those skilled in the art. Also, various polishing slurries such as, for example, an alumina-based slurry and/or a silica-based slurry can be used. The CMP process can be conducted in two steps or three steps or more. FIGS. 2 and 3 described below introduce low oxygen cleaning methods in CMP equipment.

FIG. 2 is a low oxygen scheme for post-CMP cleaning employing a nitrogen gas, in accordance with an embodiment of the present invention.

The low oxygen cleaning method involves mixing deionized (DI) water 30 and a PCMP clean 32 in the mix tank 13. The mixture is deoxygenated by an inert gas 36 before it is dispensed on the surface of the wafer 12 in post CMP process module 40. The inert gas can be, e.g., a nitrogen gas 36.

The PCMP clean 32 can include, but is not limited to, acidic cleans including, e.g., carboxylic acids, and alkaline cleans including, e.g., ammonium hydroxide.

The nitrogen gas 36 can be degassed (via degas module 38) to the mixture of DI water 30 and the PCMP clean 32. Nitrogen gas 36 is continuously purged in a liquid to reduce the dissolved oxygen concentration. After nitrogen gas 36 is purged in the liquid, the wafer 12 is exposed to the de-oxygenated liquid in post CMP module 40. Post CMP module 40 is a process chamber where the wafer 12 is cleaned with mixture of DI water and PCMP clean.

Moreover, the post CMP cleaning equipment can include components for de-oxygenating the atmosphere with an inert gas (e.g., nitrogen), which will replace air in the chamber. Thus, a complete ambient environment can be created within the post CMP module 40 for more complete protection against oxidation. Thus, an oxygen scavenger can be introduced in a low oxygen environment to contain any oxygen ingression into liquid. Stated differently, the semiconductor wafer can be exposed to a nitrogen-containing ambient and the nitrogen-containing ambient can further de-oxygenate an atmosphere the semiconductor wafer is exposed to. The nitrogen-containing ambient can be selected from the group consisting of $N_2$, $NH_3$, $NH_4$, NO, and $NH_x$, where x is between 0-1.

FIG. 3 is a low oxygen scheme for post-CMP cleaning employing a reducing agent in a liquid, in accordance with an embodiment of the present invention.

The low oxygen cleaning method involves cleaning the surface of the wafer 12 by mixture of deionized (DI) water 30, PCMP clean 32, and a reducing agent 46.

The reducing agent 46 can be, e.g., an ascorbic acid or a phosphorus acid. The reducing agent can be any type of an acidic medium which can lower the dissolved oxygen content in the liquid. As a result of lower dissolved oxygen in the liquid, this step of the present invention reduces and, in some instances, eliminates certain types of defects, which can be present in post metal CMP cleaning processes.

The nitrogen gas 36 can be degassed (via degas module 38) to the mixture of DI water 30 and the PCMP clean 32. Nitrogen gas 36 is continuously purged in a liquid to reduce the dissolved oxygen concentration. After nitrogen gas 36 is purged in the liquid, the wafer 12 is exposed to the de-oxygenated liquid in post CMP module 40. Post CMP module 40 is the process chamber where the wafer 12 is cleaned with mixture of DI water and PCMP clean.

In some embodiments of the present invention, the acidic medium that can be employed has a pH from about 2 to about 5. In other embodiments of the present invention, the acidic medium that can be employed has a pH from about 2 to about 3. Moreover, the acidic medium that can be employed includes an aqueous solution of an organic acid. In some embodiments of the present invention, the acidic medium can also include other components such as, for example, surfactants and/or stabilizing agents, so long as the other components do not adversely change the pH of the acidic medium from within the ranges mentioned above. In one embodiment of the present invention, the concentration of organic acid within the aqueous solution is from about 1.0 to about 20.0 weight percent, based on the entirety of the aqueous solution. In another embodiment of the present invention, the concentration of organic acid within the aqueous solution is from about 4.0 to about 8.0 weight percent, based on the entirety of the aqueous solution.

A natural oxygen environment can involve ambient oxygen being approximately 8 parts per million (ppm). In a low oxygen environment, the ambient oxygen concentration can be less than 30 parts per billion (ppb).

Therefore, in both FIGS. 2 and 3, a dual oxygenation process takes place. First, the liquid or liquids used to clean the surface of the semiconductor wafer is/are deoxygenated and second the atmosphere the wafer is placed in or exposed to is also deoxygenated with, e.g., an inert gas. Such inert gas can be, e.g., nitrogen. In one exemplary embodiment, the CMP post cleaning equipment can include an inlet and an exhaust. The inlet can be used to deoxygenate the liquid or liquids applied to the surface of the semiconductor wafer, whereas the outlet can be used to deoxygenate the atmosphere to semiconductor wafer is exposed to.

Figure 4:
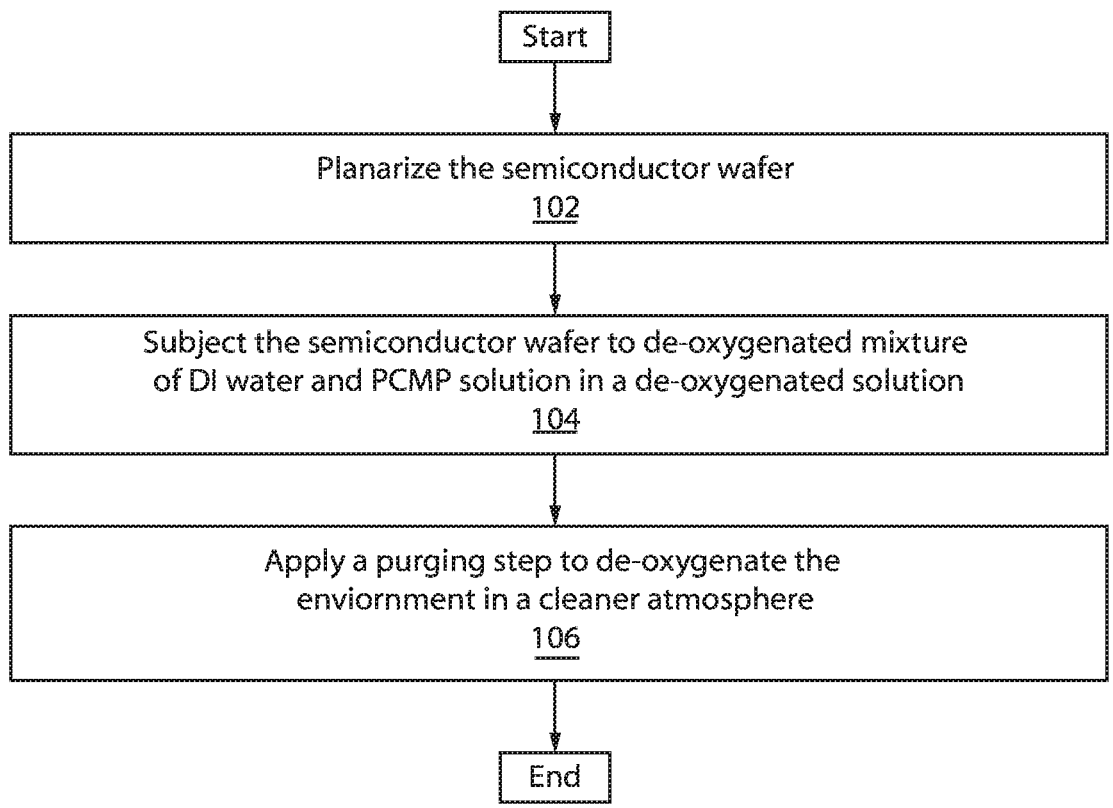
FIG. 4 is a block/flow diagram of an exemplary method for cleaning a chemically-mechanically polished semiconductor wafer, in accordance with an embodiment of the present invention.

FIG. 4 is a block/flow diagram of an exemplary method for cleaning a chemically-mechanically polished semiconductor wafer, in accordance with an embodiment of the present invention.

At block 102, the semiconductor wafer is planarized.

At block 104, the semiconductor wafer is subjected to a de-oxygenated mixture of DI water and PCMP solution in a de-oxygenated atmosphere. The PCMP solution can be an acid solution including, e.g., carboxylic acid, amino acid, or a basic solution including, e.g., hydroxyl functional group additives, such as ammonium hydroxide, tetramethyl hydroxide, etc.

At block 106, a purging step is applied to de-oxygenate an environment in a cleaner module.

In summary, semiconductor devices, including the Back-End of Line (BEOL) interconnect structures thereof, include conductive lines and other features that are formed from copper (Cu). During semiconductor device fabrication on a wafer, the Cu is deposited within trenches or vias defined in a dielectric layer. The Cu and dielectric layers are then planarized to provide a smooth and planar surface on which to deposit additional layers. A common method for planarizing is chemical mechanical planarization. CMP processes leave a residue on the exposed surface of the wafer that must be removed prior to the formation of subsequent layers. The exemplary embodiments of the present invention provide for a first low oxygen scheme, where an inert gas can be used to degas the cleaning liquid. The inert gas can be, e.g., a nitrogen gas. In a second low oxygen scheme, a reducing agent can be used to lower oxygen concentration in the cleaning process. The reducing agent can be, e.g., an ascorbic acid or a phosphorous acid. Moreover, the atmosphere can be deoxygenated. Thus, an oxygen scavenger can be introduced in a low oxygen environment to contain any oxygen ingression into liquid. In other words, the semiconductor wafer can be exposed to a nitrogen-containing ambient. The nitrogen-containing ambient can be selected from the group consisting of $N_2$, $NH_3$, $NH_4$, NO, and $NH_x$, where x is between 0-1.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath"

other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of a system and method for low oxygen cleaning in chemical mechanical planarization (CMP) equipment (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A structure for cleaning a chemically-mechanically polished semiconductor wafer by a post chemical mechanical polishing (PCMP) clean method, the structure comprising:
   a polishing pad having a polishing surface to polish the semiconductor wafer;
   a mix tank directly fed with a mixture of DI Water and PCMP solution, the mixture deoxygenated by an inert gas before the mixture is dispensed on the semiconductor wafer; and
   a post CMP module physically connected directly to the mix tank, without any intermediate physical components therebetween, and including a process chamber to receive the semiconductor wafer directly from the mix tank, the post CMP module creating a complete ambient environment therein via introduction of an oxygen scavenger.

2. The structure of claim 1, wherein the inert gas is continuously purged in a liquid to reduce dissolved oxygen concentration.

3. The method in claim 2, wherein the inert gas is a nitrogen gas.

4. The structure of claim 1, wherein the solution is deoxygenated by incorporating a reducing agent.

5. The structure of claim 4, wherein the reducing agent is an ascorbic acid.

6. The structure of claim 4, wherein the reducing agent is a phosphorous acid.

7. The structure of claim 1, wherein a nitrogen-containing ambient is selected from the group consisting of $N_2$, $NH_3$, $NH_4$, NO, and $NH_x$, where x is between 0-1.

8. A structure for cleaning a chemically-mechanically polished semiconductor wafer by a post chemical mechanical polishing (PCMP) clean method, the structure comprising:
   an inlet for receiving nitrogen gas or a reducing agent;
   a polishing pad having a polishing surface to polish the semiconductor wafer;
   a mix tank directly fed with a mixture of DI Water and PCMP solution, the mixture deoxygenated by the nitrogen gas or the reducing agent before the mixture is dispensed on the semiconductor wafer; and
   a post CMP module physically connected directly to the mix tank, without any intermediate physical components therebetween, and including a process chamber to receive the semiconductor wafer directly from the mix tank, the post CMP module creating a complete ambient environment therein via introduction of an oxygen scavenger.

9. The structure of claim 8, wherein the inert gas is continuously purged in a liquid to reduce dissolved oxygen concentration.

10. The structure of claim 1, wherein the clean method takes place in a low-oxygen environment where the ambient oxygen concentration is less than 30 parts per billion (ppb).

11. The structure of claim 8, wherein the clean method takes place in a low-oxygen environment where the ambient oxygen concentration is less than 30 parts per billion (ppb).

* * * * *